US006913869B2

(12) United States Patent
Leinenbach et al.

(10) Patent No.: US 6,913,869 B2
(45) Date of Patent: Jul. 5, 2005

(54) METHOD FOR PRODUCING LASER-ENGRAVABLE FLEXOGRAPHIC PRINTING ELEMENTS ON FLEXIBLE METALLIC SUPPORTS

(75) Inventors: Alfred Leinenbach, Ludwigshafen (DE); Margit Hiller, Karlstadt (DE); Uwe Stebani, Flörsheim-Dalsheim (DE); Thomas Telser, Weinheim (DE)

(73) Assignee: BASF Drucksysteme, Stuttgart (DE)

( * ) Notice: Subject to any disclaimer, the term of this patent is extended or adjusted under 35 U.S.C. 154(b) by 23 days.

(21) Appl. No.: 10/343,968

(22) PCT Filed: Aug. 16, 2001

(86) PCT No.: PCT/EP01/09434

§ 371 (c)(1), (2), (4) Date: Feb. 6, 2003

(87) PCT Pub. No.: WO02/16134

PCT Pub. Date: Feb. 28, 2002

(65) Prior Publication Data

US 2003/0129530 A1 Jul. 10, 2003

(30) Foreign Application Priority Data

Aug. 18, 2000 (DE) ........................................ 100 40 928

(51) Int. Cl.[7] ................................................ G03F 7/26

(52) U.S. Cl. ................ 430/306; 430/273.1; 430/275.1; 430/281.1; 430/286.1; 430/287.1; 430/348; 430/494; 430/944; 430/945; 101/463.1

(58) Field of Search .......................... 430/273.1, 275.1, 430/281.1, 286.1, 287.1, 306, 348, 494, 944, 945, 964; 101/453, 454, 463.1

(56) References Cited

U.S. PATENT DOCUMENTS

| | | | | | |
|---|---|---|---|---|---|
| 5,259,311 | A | | 11/1993 | McCaughey, Jr. | |
| 5,798,202 | A | | 8/1998 | Cushner et al. | |
| 5,804,353 | A | | 9/1998 | Cushner et al. | |
| 6,214,521 | B1 | | 4/2001 | Telser | |
| 6,511,782 | B1 | * | 1/2003 | Vermeersch et al. | 430/270.1 |
| 2002/0123003 | A1 | * | 9/2002 | Kannurpatti et al. | 430/270.1 |
| 2002/0187429 | A1 | * | 12/2002 | Kozaki et al. | 430/302 |
| 2003/0136285 | A1 | * | 7/2003 | Telser et al. | 101/463.1 |

FOREIGN PATENT DOCUMENTS

| | | |
|---|---|---|
| EP | 982 124 | 3/2000 |
| FR | 2 779 090 | 12/1999 |
| WO | 93/23252 | 11/1993 |
| WO | 93/23253 | 11/1993 |

OTHER PUBLICATIONS

Inline Veredelung uber Flexo–Lackierwerke, Deutscher Drucker 29 (1999) w2–26.
FR2779090 Abstract.

* cited by examiner

*Primary Examiner*—Barbara L. Gilliam
(74) *Attorney, Agent, or Firm*—Novak Druce & Quigg, LLP

(57) ABSTRACT

The invention relates to a method for producing laser-engravable flexographic printing elements on flexible metallic supports comprising a cross-linked elastomeric layer and an absorber for laser radiation. The invention also relates to a method for producing flexographic printing plates by means of laser engraving using flexographic printing elements of the aforementioned type, and to flexographic printing plates produced using such a method.

22 Claims, No Drawings

METHOD FOR PRODUCING LASER-ENGRAVABLE FLEXOGRAPHIC PRINTING ELEMENTS ON FLEXIBLE METALLIC SUPPORTS

The present invention relates to a process for the production of laser-engravable flexographic printing elements on flexible metallic supports which comprise a crosslinked elastomeric layer comprising an absorber for laser radiation. The present invention furthermore relates to a process for the production of flexographic printing plates by means of laser engraving using flexographic printing elements of this type, and to flexographic printing plates produced by a process of this type.

The conventional method for the production of flexographic printing plates by laying a photographic mask on a photopolymeric recording element, irradiating the element with actinic light through this mask, and washing the unpolymerized areas of the exposed element out using a developer liquid is increasingly being replaced by methods in which lasers are used.

In laser direct engraving, recesses are engraved directly into a suitable elastomeric layer with the aid of a laser of sufficiently high power, in particular by means of an IR laser, forming a relief which is suitable for printing. To this end, large amounts of the material of which the printing relief consists have to be removed. A typical flexographic printing plate is nowadays, for example, between 0.5 and 7 mm in thickness and the non-printing recesses in the plate are between 300 $\mu$m and 3 mm in depth. The method of laser direct engraving for the production of flexographic printing plates therefore only attracted commercial interest in recent years with the appearance of improved laser systems, although laser engraving of rubber printing cylinders using $CO_2$ lasers has basically been known since the late 1960s. The demand for suitable laser-engravable flexographic printing elements as starting material for the production of flexographic printing plates by means of laser engraving has thus also increased significantly.

In principle, commercially available photopolymerizable flexographic printing elements can be employed for the production of flexographic printing plates by means of laser engraving. U.S. Pat. No. 5,259,311 discloses a process in which, in a first step, the flexographic printing element is photochemically crosslinked by irradiation over the full surface and, in a second step, a printing relief is engraved in by means of a laser. However, the sensitivity of flexographic printing elements of this type to $CO_2$ lasers is low, and in addition a post-washing step for the removal of residues is necessary.

It has therefore been proposed, for example in EP-A 640 043 and EP-A 640 044, to admix substances which absorb IR radiation with the elastomeric layer to be laser-engraved in order to increase the sensitivity. However, substances of this type, such as carbon black or certain dyes, also absorb very strongly in the UV/VIS region. Flexographic printing elements which comprise these absorbers therefore can at best be photochemically crosslinked in a very thin layer, or not at all. Thus, EP-A 640 043 discloses the production of a carbon black-containing, elastomeric layer by photocrosslinking. However, this layer only has a thickness of 0.076 mm, while the typical thickness of commercially available flexographic printing plates is from 0.5 to 7 mm.

Flexographic printing plates are employed, inter alia, for the finishing of sheet-fed offset print products, for example by varnishing or gold printing (see, for example, "Inline-Veredelung über Flexo-Lackierwerke" [In-Line Finishing by Means of Flexo Varnishing Machines] Deutscher Drucker 29 (1999) w2 w6). Flexographic printing plates intended for this purpose are therefore also known as varnish plates. Particular importance is attached to registration accuracy in this area. Modern flexographic varnishing units in sheet-fed offset machines are frequently equipped with quick-action clamp bars or with fully automatic plate feed devices which are only suitable for the feed of printing plates having a metallic support. In order to be suitable for this application, commercially available flexographic printing plates on PET supports are therefore bonded to an additional aluminum support. This requires an additional working step, which is time-consuming and labor-intensive. It is therefore desirable to produce laser-engravable printing elements directly on a metallic support.

It is an object of the present invention to provide a simple and economical process for the production of laser-engravable flexographic printing plates on metallic supports.

We have found that this object is achieved by a process for the production of laser-engravable flexographic printing elements, at least comprising a flexible metallic support and a crosslinked elastomeric layer which comprises at least one absorber for laser radiation, which comprises the following steps:

(a) preparation of a thermally crosslinkable mixture by intimate mixing of at least one elastomeric binder, at least one absorber for laser radiation and at least one polymerization initiator in a suitable solvent, (b) application of the mixture to a temporary support, (c) evaporation of the solvent at a temperature $T_1$, (d) lamination of the dried layer by means of the side facing away from the support onto a flexible metallic support, (e) optionally removal of the temporary support, and (f) thermal crosslinking of the polymerizable layer by warming to a temperature $T_2$, where $T_2$ is at least 80° C. and $T_2$ is greater than $T_1$.

In a further embodiment, the invention relates to a further process for the production of laser-engravable flexographic printing elements of this type which comprises the following steps:

(a) preparation of a thermally crosslinkable mixture by intimate mixing of at least one elastomeric binder, at least one absorber for laser radiation and at least one polymerization initiator in a suitable solvent, (b) application of the mixture to a flexible, metallic support, (c) evaporation of the solvent at a temperature $T_1$, (d) thermal crosslinking of the dried, polymerizable layer by warming to a temperature $T_2$, where $T_2$ is at least 80° C. and $T_2$ is greater than $T_1$.

The invention furthermore relates to a process for the production of flexographic printing plates by engraving a printing relief by means of a laser into the flexographic printing elements obtained by the process according to the invention, and to flexographic printing plates obtained by the process.

The following details apply to the process according to the invention.

The flexographic printing elements obtained by the process according to the invention comprise a laser-engravable, crosslinked elastomeric layer on a flexible metallic support.

The term "laser-engravable" is taken to mean that the layer has the property of absorbing laser radiation, in particular the radiation from an IR laser, in such a way that it is removed or at least loosened at the points at which it has been subjected to a laser beam of sufficient intensity. The layer is preferably evaporated without prior melting or decomposed thermally or oxidatively, so that its decomposition products are removed from the layer in the form of hot gases, vapors, smoke or small particles. However, the invention also covers subsequently removing the residues of the irradiated layer by mechanical means, for example by blasting off with a liquid or a gas or also, for example, by suction or wiping off using a cloth.

The metallic flexographic printing elements support employed for the process according to the invention are flexible. For the purposes of the present invention, the term flexible is taken to mean that the supports are so thin that they can be bent around printing cylinders. On the other hand, however, they are also dimensionally stable and sufficiently thick that the support is not kinked during production of the flexographic printing element or mounting of the finished printing plate on the printing cylinder.

Suitable flexible metallic supports are in particular thin sheets or foils of steel, preferably of stainless steel, magnetizable spring steel, aluminum, zinc, magnesium, nickel, chromium or copper, it also being possible for the metals to be alloyed. It is also possible to employ combined metallic supports, for example steel sheets coated with tin, zinc, chromium, aluminum, nickel or also combinations of various metals, or also metal supports obtained by lamination of identical or different metal sheets. It is furthermore also possible to employ pretreated sheets, for example phosphated or chromatized steel sheets or anodized aluminum sheets. In general, the sheets or foils are degreased before use. Preference is given to sheets made from steel or aluminum. Particular preference is given to magnetizable spring steel. Flexographic printing plates on supports of this type can be clamped directly onto magnetic printing cylinders without adhesive tapes or the like.

The thickness of flexible metal supports of this type is usually from 0.025 mm to 0.4 mm and depends, besides on the desired degree of flexibility, also on the type of metal employed.

Supports made from steel usually have a thickness of from 0.025 to 0.30 mm, in particular from 0.14 to 0.24 mm. Supports made from aluminum usually have a thickness of from 0.25 to 0.4 mm.

The flexible metal support is advantageously provided with an anchor layer which is insoluble and swelling-resistant in printing inks. The anchor layer i.e., adhesive layer promotes good adhesion between the flexible, metallic support and the laser-engravable layer to be applied later, so that the latter does not detach on bending around the laser drum or around the printing cylinder.

It is in principle possible to employ any anchor layer in order to carry out the present process, provided that the anchor layer is insoluble and swelling-resistant in the organic solvents or solvents containing organic components which are usual in flexographic printing inks, for example ethanol or isopropanol.

An anchor layer which has proven suitable for carrying out the process according to the invention is, for example, one which comprises a binder embedded in a suitable polymeric matrix. In general, discrete domains of elastomeric binder and the matrix are evident under the microscope.

Examples of suitable binders for the anchor layer include elastomeric and thermoplastic elastomeric polymers which are usually also employed for the production of relief printing plates, such as polymers or copolymers of 1,3-dienes or SIS or SBS block copolymers. It is also possible to employ mixtures of two or more different elastomeric binders.

The amount of elastomeric binder in the anchor layer is determined by the person skilled in the art depending on the desired properties. It is usually from 10 to 70% by weight, based on the sum of all components of the anchor layer, in particular from 10 to 45% by weight and very particularly from 15 to 35% by weight.

The polymeric matrix is usually a crosslinked polymeric matrix obtainable by means of a suitable crosslinking system. The crosslinked polymeric matrix can be obtained thermally by polycondensation or polyaddition of suitable monomers or oligomers, for example by reaction of polyisocyanates and suitable hydroxyl-containing compounds, such as hydroxyl-containing polyurethane resins or polyester resins, with formation of crosslinked polyurethanes.

If desired, the anchor layer may contain further components and auxiliaries, for example additional binders for influencing the properties, dyes, pigments or plasticizers.

For the production of the anchor layer, the binder and the further components of the anchor layer are usually dissolved in suitable solvents, for example THF, toluene or ethyl acetate, and mixed vigorously with one another, and the solution is filtered if necessary and applied to the flexible metallic support. The application can take place, for example, by means of a roll or by means of a caster. After the application, the solvent is evaporated, and the system is subsequently crosslinked. The residual solvent content in the layer should be less than 5% by weight, based on all constituents of the layer.

The thickness of the anchor layer is usually from 2 to 100 $\mu$m, preferably from 10 to 50 $\mu$m and particularly preferably from 15 to 30 $\mu$m. It is also possible to employ a plurality of anchor layers of identical, approximately identical or different composition one on top of the other.

The outlined anchor layer firstly promotes good adhesion between the laser-engravable layer and the flexible metallic support and is insoluble and non-swellable in organic solvents usually used for flexographic printing inks. In addition, they have particularly good freedom from tack. This is particularly advantageous if the metallic supports are not processed further immediately after coating. Metallic supports coated in this way can be stacked or rolled during production without additional measures, for example insertion of paper as interlayer, without sticking together. The invention naturally also covers in-line application of an anchor layer.

For the production of the laser-engravable elastomeric layer, an intimate mixture of at least one elastomeric binder, at least one polymerization initiator and at least one absorber for laser radiation is prepared in a suitable solvent in one process step. The mixture may in addition comprise ethylenically unsaturated monomers and further auxiliaries and/or additives.

The elastomeric binders employed can be the known binders usually used for the production of photopolymerizable flexographic printing plates. In principle, both elastomeric binders and thermoplastic elastomeric binders are suitable. Examples of suitable binders are the known three-block copolymers of the SIS or SBS type, which may also be fully or partially hydrogenated. It is also possible to employ elastomeric polymers of the ethylene-propylene-diene type, ethylene-acrylic acid rubbers or elastomeric polymers based on acrylates or acrylate copolymers. Further examples of suitable polymers are disclosed in DE-A 22 15 090, EP-A 084 851, EP-A 819 984 or EP-A 553 662. The polymeric binders may contain crosslinkable groups, for example ethylenically unsaturated groups, in the main chain of the polymer. It is also possible to employ binders containing crosslinkable side groups.

It is also possible to employ mixtures of two or more different binders.

The type and amount of the binder employed are selected by the person skilled in the art depending on the desired properties of the printing relief. In general, the amount of binder is from 50 to 95% by weight, based on the amount of all constituents of the dried, laser-engravable layer, i.e. without taking into account the solvent. The amount is preferably from 60 to 90% by weight.

The recording layer according to the invention furthermore comprises at least one absorber for laser radiation. It is also possible to employ mixtures of different absorbers for laser radiation. Suitable absorbers for laser radiation have high absorption in the region of the laser wavelength. Particularly suitable absorbers are those which have high absorption in the near infra-red and in the longer-wave VIS region of the electromagnetic spectrum. Absorbers of this type are particularly suitable for the absorption of the radiation from high-power Nd:YAG lasers (1064 nm) and from IR diode lasers, which typically have wavelengths between 700 and 900 nm and between 1200 and 1600 nm.

Examples of suitable absorbers for the laser radiation are dyes which absorb strongly in the infra-red spectral region, for example phthalocyanines, naphthalocyanines, cyanines, quinones, metal complex dyes, for example dithiolenes, or photochromic dyes.

Further suitable absorbers are inorganic pigments, in particular intensely colored inorganic pigments, for example chromium oxides, iron oxides, carbon black or metallic particles.

Particularly suitable absorbers for laser radiation are finely divided carbon black grades having a particle size of from 10 to 50 nm.

Further particularly suitable absorbers for laser radiation are iron-containing solids, in particular intensely colored iron oxides. Iron oxides of this type are commercially available and are usually employed as colored pigments or as pigments for magnetic recording. Suitable absorbers for laser radiation are, for example, FeO, goethite $\alpha$-FeOOH, akaganeite $\beta$-FeOOH, lepidocrocite $\gamma$-FeOOH, hematite $\alpha$-$Fe_2O_3$, maghemite $\gamma$-$Fe_2O_3$, magnetite $Fe_3O_4$ or berthollide. It is furthermore possible to employ doped iron oxides or mixed oxides of iron with other metals. Examples of mixed oxides are umbra $Fe_2O_3$x n $MnO_2$ or $Fe_xAl_{(1-x)}OOH$, in particular various spinel black pigments, for example $Cu(Cr,Fe)_2O_4$, $Co(Cr,Fe)_2O_4$ or $Cu(Cr,Fe,Mn)_2O_4$. Examples of dopants are P, Si, Al, Mg, Zn and Cr. Dopants of this type are generally added in small amounts during the synthesis of the oxides in order to control the particle size and particle shape. The iron oxides may also be coated. Coatings of this type can be applied, in order to improve the dispersibility of the particles. These coatings may consist, for example, of inorganic compounds, such as $SiO_2$ and/or AlOOH. However, it is also possible to apply organic coatings, for example organic adhesion promoters, such as aminopropyl(trimethoxy)silane. Particularly suitable absorbers for laser radiation are FeOOH, $Fe_2O_3$ and $Fe_3O_4$, very particularly preferably $Fe_3O_4$.

The size of the iron-containing, inorganic solids employed, in particular the iron oxides, is selected by the person skilled in the art depending on the desired properties of the recording material. However, solids having a mean particle size of greater than 10 $\mu$m are generally unsuitable.

Since iron oxides, in particular, are anisometric, this dimension refers to the longest axis. The particle size is preferably less than 1 $\mu$m. It is also possible to employ so-called transparent iron oxides, which have a particle size of less than 0.1 $\mu$m and a specific surface area of up to 150 $m^2$/g.

Further iron-containing compounds which are suitable as absorbers for laser radiation are iron metal pigments. Particularly suitable are needle-shaped or rice grain-shaped pigments having a length of from 0.1 to 1 $\mu$m. Pigments of this type are known as magnetic pigments for magnetic recording. Besides iron, further dopants, such as Al, Si, Mg, P, Co, Ni, Nd or Y, may also be present, or the iron metal pigments may be coated therewith. Iron metal pigments are partially oxidized on the surface for protection against corrosion and consist of a doped or undoped iron core and a doped or undoped iron oxide shell.

At least 0.1% by weight of absorber, based on the sum of all constituents of the laser-engravable elastomeric layer, is employed. The amount of absorber added is selected by the person skilled in the art depending on the respective desired properties of the laser-engravable flexographic printing element. In this connection, the person skilled in the art will take into account that the absorbers added affect not only the rate and efficiency of the engraving of the elastomeric layer by laser, but also other properties of the flexographic printing element, for example its hardness, elasticity, thermal conductivity, abrasion resistance and ink take-up. In general, therefore, more than 20% by weight of absorber for laser radiation, based on the sum of all constituents of the laser-engravable elastomeric layer, is unsuitable. The amount of absorber for laser radiation is preferably from 0.5 to 15% by weight and particularly preferably from 0.5 to 10% by weight.

Polymerization initiators which can be employed are in principle commercially available thermal initiators for free-radical polymerization, for example peroxides, hydroperoxides or azo compounds.

The choice of suitable initiators has particular importance for carrying out the process according to the invention. Suitable thermal initiators do not decompose into free radicals at high reaction rate until the final step of the process according to the invention, the thermal crosslinking. They are substantially thermally stable in the preceding process steps of mixing and dispersion, casting, evaporation of the solvent and lamination. The term "thermally substantially stable" in this connection means that the initiators decompose at most so slowly during performance of these steps of the process according to the invention that crosslinking of the layer and/or of the mixture by polymerization can only take place to a secondary extent, and does not impair the orderly performance of the process.

The thermal stability of an initiator is usually indicated by means of the temperature of the 10 hour half life 10 h-$t_{1/2}$, i.e. the temperature at which 50% of the original initiator amount has decomposed to form free radicals after 10 hours. Further details in this respect are give in "Encyclopedia of Polymer Science and Engineering", Vol. 11, pages 1 ff., John Wiley & Sons, New York, 1988. Particularly suitable initiators for carrying out the process according to the invention usually have a 10 h-$t_{1/2}$ of at least 60° C., preferably of at least 70° C. Particularly suitable initiators have a 10 h-$t_{1/2}$ of at least 80° C.

Particularly suitable initiators for carrying out the process according to the invention usually have a 10 h-$t_{1/2}$ of at least 60° C., preferably of at least 70° C. Particularly suitable initiators have a 10 h-$t_{1/2}$ of at least 80° C.

Examples of suitable initiators include certain propoxy esters, such as t-butyl peroctanoate, t-amyl peroctanoate, t-butyl peroxyisobutyrate, t-butyl peroxymaleate, t-amyl perbenzoate, di-t-butyl diperoxyphthalate, t-butyl perbenzoate, t-butyl peracetate and 2,5-di(benzoylperoxy)-2,5-dimethylhexane, certain diperoxyketals, such as 1,1-di(t-amylperoxy)cyclohexane, 1,1-di(t-butylperoxy) cyclohexane, 2,2-di(t-butylperoxy)butane and ethyl 3,3-di(t-butylperoxy)butyrate, certain dialkyl peroxides, such as di-t-butyl peroxide, t-butyl cumene peroxide or 2,5-di(t-butylperoxy)-2,5-dimethylhexane, certain diacyl peroxides, such as dibenzoyl peroxide or diacetyl peroxide, certain t-alkyl hydroperoxides, such as t-butyl hydroperoxide, t-amyl hydroperoxide, pinane hydroperoxide and cumene hydroperoxide. Also suitable are certain azo compounds, for example 1-(t-butylazo)formamide, 2-(t-butylazo) isobutyronitrile, 1-(t-butylazo)cyclohexanecarbonitrile, 2-(t-butylazo)-2-methylbutanenitrile, 2,2'-azobis(2-acetoxypropane), 1,1'-azobis(cyclohexanecarbonitrile), 2,2'-azobis(isobutyronitrile) and 2,2'-azobis(2-methylbutanenitrile).

From 1 to 15% by weight, preferably from 1 to 10% by weight, of initiator, based on the amount of all constituents of the laser-engravable layer, are usually employed.

The process according to the invention can be carried out by using only the ethylenically unsaturated groups present as side groups or in the main chain of the binder for the crosslinking. However, it is also possible to employ in addition ethylenically unsaturated monomers. The ethylenically unsaturated monomers employed can basically be those usually also employed for the production of photopolymerizable flexographic printing elements. The monomers should be compatible with the binders and have at least one polymerizable, ethylenically unsaturated double bond. Esters and amides of acrylic acid or methacrylic acid with mono- or polyfunctional alcohols, amines, aminoalcohols or hydroxyethers and -esters, styrene or substituted styrenes, esters of fumaric or maleic acid or allyl compounds have proven particularly advantageous. Examples of suitable monomers are butyl acrylate, 2-ethylhexyl acrylate, lauryl acrylate, 1,4-butanediol diacrylate, 1,6-hexanediol diacrylate, 1,6-hexanediol dimethacrylate, 1,9-nonanediol diacrylate, trimethylolpropane triacrylate, dioctyl fumarate, N-dodecylmaleimide. It is also possible to employ mixtures of different monomers. The type and amount of the monomer is determined by person skilled in the art depending on the desired properties and the binder employed. In general, however, the total amount of the monomers is not greater than 30% by weight, based on the amount of all constituents of the laser-engravable layer, and preferably not greater than 20% by weight.

If desired, further additives and auxiliaries, for example plasticizers, fillers, dyes, compatibilizers or dispersion auxiliaries, can be employed in order to set the desired properties of the relief layer. The amount of such further constituents should, however, generally not exceed 20% by weight, preferably 10% by weight.

The constituents for the production of the laser-engravable layer are intimately mixed with one another in a suitable solvent, giving a homogeneous mixture or dispersion of the constituents. In general, it is advisable to dissolve all organic constituents of the layer as completely as possible, and to disperse inorganic constituents, for example carbon black or iron oxide pigments as absorbers for laser radiation, uniformly in the organic matrix.

A suitable solvent is selected by the person skilled in the art depending on the constituents used in the layer. Suitable solvents include, in particular, toluene, xylenes, cyclohexane and THF. It is also possible to employ mixtures of different solvents.

The intimate mixing of the constituents can be carried out at room temperature or also at temperatures above room temperature. The person skilled in the art will ensure that he selects a temperature for the dissolution process which is matched to the boiling point of the solvent and the 10 h-$t_{1/2}$ of the initiator. In general, the mixing should not be carried out at temperatures above 60° C. The intimate mixing can be carried out using conventional stirring or dispersion units. If necessary, the solution can be filtered before use.

In the first embodiment of the process according to the invention, the mixture is applied to a temporary support. Suitable temporary supports are, in particular, PET films, which, in order to simplify later peeling-off, may also be modified, for example by siliconization. The application is generally carried out by means of a roll or caster, the thickness adjustment of the layer being carried out by means of parameters known in principle to the person skilled in the art, such as adjustment of the casting gap, take-off rate and/or viscosity of the solution. After application, the solvent is evaporated at a temperature $T_1$. The evaporation of solvent can be carried out, for example, in a drying tunnel. The temperature $T_1$ can be selected by the person skilled in the art depending on the desired circumstances, for example the boiling point of the solvent, the desired drying rate or the desired residual solvent content. In general, $T_1$ is greater than 25° C. $T_1$ is preferably between 30° C. and 80° C. and is for example 40° C. However, it is also possible to select temperatures above 80° C. in particular cases. In order to avoid premature polymerization, however, the temperature $T_1$ is in all cases lower than the temperature $T_2$ at which thermal crosslinking is effected in a later process step. The residual solvent content in the layer after the drying operation should be less than 5% by weight, based on all constituents of the layer. The residual solvent content is preferably less than 3% by weight, based on the sum of all constituents of the layer.

It is also possible to cast a plurality of laser-engravable layers of identical, approximately identical or different composition one on top of the other. In principle, casting can be carried out either wet-on-wet, or the respective lower layer can firstly be partially dried or fully dried before the second layer is cast on.

Furthermore, it is possible, if desired, to cast additional layers, which take on other tasks in the system, and their composition therefore differs from that of the laser-engravable layer(s).

For example, it is possible to cast a thin upper layer which forms the printing surface in the finished flexographic printing plate. An upper layer of this type allows parameters which are essential for the printing behavior and ink transfer, such as roughness, abrasiveness, surface tension, surface tack, ink take-up or solvent resistance, on the printing surface to be modified without the relief-typical properties of the printing plate, for example hardness or elasticity, being affected. Surface properties and layer properties can thus be modified independently of one another in order to achieve an optimum print result. The upper layer may comprise an absorber for laser radiation without this being absolutely necessary. The composition of the upper layer is only restricted inasmuch as the laser engraving of the laser-engravable layer beneath it must not be impaired and the upper layer must be removable together therewith. The upper layer should be thin compared with the laser-engravable layer. The thickness of an upper layer of this type should generally not exceed 100 $\mu$m, with the thickness preferably being between 5 and 80 $\mu$m, particularly preferably between 10 and 50 $\mu$m.

It is furthermore also possible to cast a thermally polymerizable, but not laser-engravable underlayer located between the support and the laser-engravable layer in the finished flexographic printing element. By means of underlayers of this type, the mechanical properties of the relief printing plates can be modified without affecting the relief-typical properties of the printing plate.

The dried, thermally polymerizable layer or the multilayer system of corresponding layers is laminated with the side facing away from a temporary support onto the flexible metallic support using a suitable solvent. An example of a suitable lamination solvent is tetrahydrofuran.

After the lamination, it is advisable to peel off the temporary support in order to prevent potential complications owing to shrinkage or excessive adhesion of the support to the laser-engravable layer during the crosslinking, although this is not absolutely necessary in every individual case.

In the final process step for the production of the flexographic printing element according to the invention, the polymerizable layer is thermally crosslinked by warming to the temperature $T_2$. The temperature $T_2$ is at least 80° C. and is above $T_1$. The difference between $T_1$ and $T_2$ is determined by the person skilled in the art depending on the specific circumstances. In general, a difference of at least 10° C. is advisable, preferably a difference of at least 20° C. and particularly preferably a difference of at least 30° C. Larger differences, for example those of 50° C., can also be selected. In general, $T_2$ is between 80° C. and 180° C., preferably between 80° C. and 150° C. and particularly preferably between 90° C. and 130° C. For example, $T_2$ is 100° C.

The thickness of the crosslinked, elastomeric layer or of the multilayer system is generally from 0.1 to 7 mm, preferably from 0.5 to 5 mm. A suitable thickness is selected by the person skilled in the art depending on the desired application of the printing plate.

If the laser-engravable flexographic printing element no longer has a temporary support, it can, if desired, be protected by a protective film, for example a PET film, which is laid or laminated onto the surface.

In a further embodiment of the process according to the invention, the laser-engravable layer is not cast onto a temporary support, but instead directly onto the flexible metallic support, which may, if desired, have been coated with an anchor layer. The lamination step is thus superfluous.

The laser-engravable flexographic printing elements obtained by the process according to the invention serve as starting material for the production of flexographic printing plates.

The process comprises firstly peeling off any protective film present. In the following process step, a printing relief is engraved into the flexographic printing element by means of a laser. Pixels whose edges initially drop vertically and only widen in the lower region are advantageously engraved. This results in good support of the image dots, but nevertheless low dot gain. However, it is also possible to engrave image dot edges of a different shape.

Particularly suitable for laser engraving are Nd:YAG lasers (1064 nm), IR diode lasers, which typically have wavelengths of from 700 to 900 nm and from 1200 to 1600 nm, and $CO_2$ lasers having a wavelength of 10640 nm. However, it is also possible to employ lasers of shorter wavelength, provided that the lasers have adequate intensity. For example, a frequency-doubled (532 nm) or frequency-trebled (355 nm) Nd:YAG laser can also be employed. Laser equipment of this type is commercially available. The image information to be engraved is transferred directly from the layout computer system to the laser equipment. The lasers can be operated either continuously or in pulsed mode.

The laser engraving can advantageously be carried out in the presence of an oxygen-containing gas, in particular air. The oxygen-containing gas can be blown over the recording element during the engraving. A comparatively gentle gas stream can be generated, for example, with the aid of a fan. However, it is also possible to blow a stronger stream over the recording material with the aid of a suitable nozzle. This embodiment has the advantage that detached solid constituents of the layer can be removed effectively.

The flexographic printing plate obtained can, if desired, subsequently be cleaned. A cleaning step of this type removes layer constituents which have been detached, but not yet been completely removed from the plate surface. The printing plate can, for example, be cleaned using a brush. This cleaning process can be supported by a suitable aqueous and/or organic solvent. A suitable solvent is selected by the person skilled in the art with the proviso that it must not dissolve or greatly swell the relief layer. However, the cleaning can also be carried out, for example, using compressed air or by vacuum.

The process according to the invention gives flexographic printing plates on metallic supports which have been produced by laser engraving and are distinguished by excellent dimensional stability. They are particularly suitable for use in flexographic varnishing units of sheet-fed offset printing machines.

The examples below are intended to explain the invention in greater detail without representing a limitation.

Experimental

For the laser engraving experiments, the laser-engravable flexographic printing elements were stuck to the cylinder of an ALE laser machine (Meridian Finesse) by means of an adhesive tape. This machine is fitted with an Nd:YAG laser having a power of 130 W. After adjusting the focus to the plate thickness, the plate was exposed to the laser radiation at a rate of 160 cm/s and a feed rate of 20 μm.

EXAMPLE 1

A mixture of the following components was prepared in toluene at a temperature of 30° C.:

| Component | Starting Material | Proportion by weight [%] (without toluene) |
|---|---|---|
| Binder | Kraton 1161, SIS block copolymer, Shell | 77 |
| | α-Methylstyrene-vinyltoluene copolymer Piccotex 100, Hercules | 8 |
| Monomers | Hexanediol diacrylate | 7 |
| | Hexanediol dimethacrylate | 4 |
| Carbon black | Printex U, Degussa | 1 |
| Initiator | tert-Butyl peroctanoate (10h-$t_{1/2}$ 73° C.) | 3 |

The components were dissolved, and the carbon black was dispersed therein. The homogeneous dispersion obtained was degassed and coated onto a PET film as temporary support (Lumirror X43, 150 μm) by means of a chamber caster. After drying (2 hours at 40° C., fan-assisted), the dry layer thickness was 950 μm. This layer was bonded by lamination to a metallic support (steel, thickness 0.14 mm) coated with adhesive lacquer. The film was subsequently peeled off. The dried layer was thermochemically crosslinked by warming at 100° C. for 45 minutes.

Laser Engraving:

The laser-engravable flexographic printing element obtained was engraved by means of lasers as described above. A relief depth of 460 μm was obtained. The resolution was 60 lines/cm.

EXAMPLE 2

The mixture obtained in Example 1 was cast directly onto a metallic support (steel, thickness 0.05 mm) coated with an adhesive lacquer by means of a chamber caster. The layer was dried at 40° C. for 2 hours. The dried layer was thermochemically crosslinked by warming at 100° C. for 45 minutes.

Laser Engraving:

The laser-engravable flexographic printing element obtained was engraved by means of lasers as described above. A relief depth of 460 μm was obtained. The resolution was 60 lines/cm.

EXAMPLE 3

A mixture of the following components was prepared in toluene at a temperature of 30° C.:

| Component | Starting material | Proportion by weight [%] (without toluene) |
|---|---|---|
| Binder | EPDM rubber Keltan 1446A, DSM | 77 |
| | α-Methylstyrene-vinyltoluene copolymer Piccotex 100, Hercules | 8 |
| Monomers | Hexanediol diacrylate | 7 |
| | Hexanediol dimethacrylate | 4 |
| Carbon black | Printex U, Degussa | 1 |
| Initiator | Tert-Butyl peroctanoate ($10h\text{-}t_{1/2}$ 73° C.) | 3 |

The components were dissolved, and the carbon black was dispersed therein. The homogeneous dispersion obtained was degassed and coated onto a PET film as temporary support (Lumirror X43, 150 μm) by means of a chamber caster. After drying (2 hours at 40° C., fan-assisted), the dry layer thickness was 950 μm. This layer was bonded by lamination to a metallic support (steel, thickness 0.14 mm) coated with adhesive lacquer. The film was subsequently peeled off. The dried layer was thermochemically crosslinked by warming at 100° C. for 45 minutes.

Laser Engraving:

The laser-engravable flexographic printing element obtained was engraved by means of lasers as described above. A relief depth of 530 μm was obtained. The resolution was 60 lines/cm.

EXAMPLE 4

The mixture obtained in Example 3 was cast directly onto a metallic support (steel, thickness 0.05 mm) coated with an adhesive lacquer by means of a chamber caster. The layer was dried at 40° C. for 2 hours. The dried layer was thermochemically crosslinked by warming at 100° C. for 45 minutes.

Laser Engraving:

The laser-engravable flexographic printing element obtained was engraved by means of lasers as described above. A relief depth of 540 μm was obtained. The resolution was 60 lines/cm.

What is claimed is:

1. A process for the production of laser-engravable flexographic printing elements, at least comprising a flexible metallic support and a crosslinked elastomeric layer which comprises at least one absorber for laser radiation, which comprises the following steps:

(a) preparation of a thermally crosslinked mixture by intimate mixing of at least one elastomeric binder, 0.5 to 20% by weight of at least one absorber for laser radiation and at least one polymerization initiator whose 10 h-$t_{1/2}$ 10 hour half-life temperature is at least 60° C., in a suitable solvent, (b) application of the mixture to a temporary support, (c) evaporation of the solvent at a temperature $T_1$, (d) lamination of the dried layer by means of the side facing away from the support onto a flexible metallic support, (e) optionally removal of the temporary support, and (f) thermal crosslinking of the polymerizable layer by warming to a temperature $T_2$ where $T_2$ is at least 80° C. and $T_2$ is greater than $T_1$, the thickness of the crosslinked elastomeric layer being from 0.5 to 5 mm.

2. A process as claimed in claim 1, wherein the thermally crosslinkable mixture furthermore comprises at least one ethylenically unsaturated monomer.

3. A process as claimed in claim 1, wherein the thermally crosslinkable, mixture comprises further additives and auxiliaries.

4. A process as claimed in claim 1, wherein the flexible, metallic support is a support made from aluminum, steel or magnetizable spring steel.

5. A process as claimed in claim 1, wherein the flexible metallic support is provided with an adhesive layer.

6. A process as claimed in claim 1, wherein the amount of the absorber for laser radiation is from 0.5 to 10% by weight, based on the amount of all constituents of the crosslinked, elastomeric layer.

7. A process as claimed in claim 1, wherein the absorber for laser radiation is carbon black and/or an iron-containing, inorganic solid.

8. A process for the production of flexographic printing plates, which comprises engraving a relief into a laser-engravable flexographic printing element produced by a process as claimed in claim 1, by means of a laser.

9. A flexographic printing plate produced by a process as claimed in claim 8.

10. The process of claim 1 wherein the metallic support is made from magnetizable spring steel.

11. The process of claim 1, wherein from 1–10% by weight of the polymerization initiator is used.

12. A process for the production of laser-engravable flexographic printing elements, at least comprising a flexible metallic support and a crosslinked elastomeric layer which comprises at least one absorber for laser radiation, which comprises the following steps:

(a) preparation of a thermally crosslinkable mixture by intimate mixing of at least one elastomeric binder, 0.5 to 20% by weight of at least one absorber for laser radiation and at least one polymerization initiator whose 10 h-$t_{1/2}$ 10 hour half-life temperature is at least 60° C., in a suitable solvent, (b) application of the mixture to a flexible, metallic support, (c) evaporation of the solvent at a temperature $T_1$, (d) thermal crosslinking of the dried, polymerizable layer by warming to a temperature $T_2$, where $T_2$ is at least 80° C. and $T_2$ is greater than $T_1$, the thickness of the crosslinked elastomeric layer being from 0.5 to 7 mm.

13. A process as claimed in claim 12, wherein the thermally crosslinkable mixture furthermore comprises at least one ethylenically unsaturated monomer.

14. A process as claimed in claim 12, wherein the thermally crosslinkable mixture comprises further additives and auxiliaries.

15. A process as claimed in claim 12, wherein the flexible, metallic support is a support made from aluminum, steel or magnetizable spring steel.

16. A process as claimed in claim 12, wherein the flexible, metallic support is provided with an adhesive layer.

17. A process as claimed in claim 12, wherein the amount of the absorber for laser radiation is from 0.5 to 10% by weight, based on the amount of all constituents of the crosslinked, elastomeric layer.

18. A process as claimed in claim 12, wherein the absorber for laser radiation is carbon black and/or an iron-containing, inorganic solid.

19. A process for the production of flexographic printing plates, which comprises engraving a relief into a laser-engravable flexographic printing element produced by a process as claimed in claim 12, by means of a laser.

20. A flexographic printing plate produced by a process as claimed in claim 19.

21. The process of claim 12, wherein the metallic support is made from magnetizable spring steel.

22. The process of claim 12, wherein from 1–10% by weight of the polymerization initiator is used.

* * * * *